(12) United States Patent
Silva

(10) Patent No.: US 7,114,531 B2
(45) Date of Patent: Oct. 3, 2006

(54) SYSTEM AND METHOD FOR PURGING HIGH PURITY INTERFACES

(76) Inventor: David James Silva, 11081 Negley Ave., San Diego, CA (US) 92131

( * ) Notice: Subject to any disclaimer, the term of this patent is extended or adjusted under 35 U.S.C. 154(b) by 190 days.

(21) Appl. No.: 10/909,854

(22) Filed: Aug. 2, 2004

(65) Prior Publication Data

US 2006/0027281 A1   Feb. 9, 2006

Related U.S. Application Data

(63) Continuation-in-part of application No. 10/890,550, filed on Jul. 13, 2004.

(51) Int. Cl.
*B65B 31/00* (2006.01)

(52) U.S. Cl. .................. 141/3; 141/4; 141/47; 141/302; 137/606

(58) Field of Classification Search ............ 141/4, 141/8, 47–50, 63, 65, 302; 137/206, 209, 137/606, 861, 863
See application file for complete search history.

(56) References Cited

U.S. PATENT DOCUMENTS

| | | | |
|---|---|---|---|
| 5,964,230 A | 10/1999 | Voloshin et al. | |
| 6,138,691 A | 10/2000 | Voloshin et al. | |
| 6,431,229 B1 | 8/2002 | Birtcher et al. | |
| 6,648,034 B1 | 11/2003 | Birtcher et al. | |
| 6,966,348 B1 * | 11/2005 | Steidl et al. ................ | 141/302 |
| 2003/0131885 A1 | 7/2003 | Birtcher et al. | |
| 2004/0109769 A1 * | 6/2004 | Jahn et al. .................. | 417/395 |
| 2004/0136843 A1 * | 7/2004 | Jahn et al. .................. | 417/395 |
| 2005/0051234 A1 * | 3/2005 | Steidl et al. ................ | 141/234 |
| 2006/0011258 A1 * | 1/2006 | Silva .......................... | 141/63 |
| 2006/0060254 A1 * | 3/2006 | Silva .......................... | 137/885 |

FOREIGN PATENT DOCUMENTS

JP   2004-063833   2/2004

* cited by examiner

*Primary Examiner*—David J. Walczak
*Assistant Examiner*—Peter deVore
(74) *Attorney, Agent, or Firm*—Serafini Associates; Franco A. Serafini

(57) ABSTRACT

A system for purging high purity interfaces connecting a high purity chemical container to process lines comprises a first purging manifold, connected at one end to a first adapter manifold extending from the high purity chemical container, and connected at the other end either to a process tool, to a second high purity container, to a source of gas, or to a source of vacuum on one side, or to a source of vent or to a source of vacuum on the other side; and a second purging manifold connecting the second adapter manifold either to a source of push gas, a source of purge gas, or a source of vacuum; or to a source of vent. A related method comprises blowing purge gas through both the first and the second purging manifolds, and, optionally, applying vacuum to both purging manifolds.

18 Claims, 2 Drawing Sheets

SYSTEM AND METHOD FOR PURGING HIGH PURITY INTERFACES

CROSS-REFERENCE TO RELATED APPLICATIONS

The present application is a continuation-in-part of application Ser. No. 10/890,550 filed on Jul. 13, 2004 and titled "Purgeable Manifold System."

STATEMENT REGARDING FEDERALLY SPONSORED REASEARCH AND DEVELOPMENT

Not applicable.

REFERENCE TO A COMPUTER LISTING, A TABLE, OR A COMPUTER PROGRAM LISTING COMPACT DISK APPENDIX

Not applicable.

BACKGROUND OF THE INVENTION

1. Field of the Invention

The present invention concerns a system and a method for purging high purity interfaces. More specifically, the present invention concerns a manifold system and a method for purging interfaces connected to containers of high purity, low vapor pressure chemicals, wherein potential areas of entrapment of the low vapor pressure chemical are eliminated.

2. Description of Related Art

Certain manufacturing processes require the use of low vapor pressure chemicals at high purity levels. One example is semiconductor manufacturing, which requires the distribution of highly reactive, low vapor pressure chemicals in high purity conditions, in order to avoid unwanted contamination during the fabrication process and to maintain competitive process yields. These low vapor pressure chemicals include, among others, organo-metallic precursors such as tetrakis(dimethylamido) titanium (TDMAT), tetrakis(diethylamino) titanium (TDEAT), tantalum pentaethoxide (TAETO), copper hexafluoroacetylacetonate-trimethylvinylsilane (Cu(hfac)TMVS), tetramethyltetracyclosiloxane (TMCTS), tetraethyl ortosilicate (TEOS), and trimethylphosphate (TMP). Typically, these low pressure chemicals are stored in containers having a capacity varying from 100 milliliters to 200 liters, which are known by a variety of common and trade names such as "canisters," "ampoules," or "hosts", and are delivered to chemical vapor deposition (CVD) process tools, either by a direct liquid injection (DLI) process or by a "bubbler" process.

With DLI, the low vapor pressure chemical is delivered to a process tool by injecting a push gas (generally, an inert gas such as nitrogen or helium) through a first manifold into the container, in the headspace above the low vapor pressure chemical in liquid state. The increase in gas pressure inside the container causes the low vapor pressure chemical to be ejected from the container through a diptube immersed in the chemical and then through a second manifold connected to the container, and to be delivered eventually to the process tool, either directly, or by means of an intermediate, "refill" container.

With the "bubbler" process, a push gas (generally, an inert gas such as nitrogen or helium) is injected into the container through a first manifold connected to the container and through a diptube immersed in the low vapor pressure chemical in the container. Instead, the low vapor pressure chemical is supplied to the container as a liquid by means of pressurized gas delivery through a second manifold. The container is heated, in order to increase vapor pressure and to saturate the bubbling gas with vaporized chemical, and the bubbling mixture of gas and chemical is then ejected from the container through a third manifold and delivered to a process tool. The container needs to be refilled with the low vapor pressure chemical on a regular basis. A first container storing liquid low vapor pressure chemical may act as a "refill" container, providing a continuing supply of low vapor pressure chemical to the primary, "bubbler" container.

From time to time, it is necessary to replace and clean a container storing liquid low vapor pressure chemical, for instance, due to maintenance requirements, or due to decomposition of the low vapor chemical within the container, or for other reasons. Before detaching the container from the process chemical delivery lines, the low vapor pressure chemical must be completely removed from the points of connection between the manifold valves and the process lines. Typically, the low vapor pressure chemical is evacuated and purged through a multi-step procedure comprising sequences of blow cycles, which push the residual chemical into the container, and of vacuum cycles, which vaporize and remove the chemical particles trapped into the manifolds. Because of the high level of decontamination required, and because some liquid low vapor pressure chemical may remain trapped within the interstices, or dead spaces, of the system, this procedure is extremely time consuming and affects process yields significantly. Therefore, there is a need for a manifold system that can be purged with reduced cycle times.

Different invention have been disclosed in the prior art addressing the above needs to different degrees. U.S. Pat. No. 5,964,230 and U.S. Pat. No. 6,138,691, both to Voloshin et al., teach a solvent purging system that not only adds complexity to the purging procedure, but that also creates the additional requirement of expensive decontamination of highly toxic chemicals from the solvent.

U.S. Pat. No. 6,431,229 to Birtcher et al. discloses a solventless, purgeable, diaphragm valved manifold for low vapor pressure chemicals, comprising a block valve assembly that includes two diaphragm valves. There remains a dead space between the two valves in the valve block assembly, which complicates cleaning and which requires longer purge cycles in order to remove the chemical from that dead space.

U.S. Pat. No. 6,648,034 to Birtcher et al. teaches a purgeable manifold for low pressure chemical containers, with similar features and drawbacks as the invention taught in U.S. Pat. No. 6,431,229.

U.S. Patent Application 2003/0131885 to Birtcher et al. discloses a cabinet for chemical delivery with solvent purging, which includes some of the features and drawbacks of the inventions disclosed in U.S. Pat. Nos. 6,138,691 and 6,431,229.

Japanese Patent JP 2004-063833 A to Yoshitome Koichi teaches a low pressure chemical supply system for use in a CVD process, comprising a manifold block fed by entry and exit valves and containing a bypass route with two additional valves. While this invention appears to offer process improvements over the invention disclosed in U.S. Pat. No. 6,431,229, this supply system still contains dead spaces where the low pressure chemical may be trapped, requiring extended purge cycles.

None of the above inventions appears to disclose a system or method for purging high purity interfaces that eliminates dead spaces and also costly specialty valves.

BRIEF SUMMARY OF THE INVENTION

The present invention teaches a system and a method for purging high purity interfaces between the manifolds extending from a DLI container or a "refill" container and the process lines, and may be embodied in a variety of forms.

A first embodiment comprises a system including a first purging manifold, connected at one end by a low dead space fitting to a first adapter manifold extending from the high purity chemical container, and connected at the other end by low dead space fittings either to a process tool, to a second high purity container, to a source of gas, or to a source of vacuum on one side, or to a source of vent or to a source of vacuum on the other side. It further comprises a second purging manifold, connected at one end by a low dead space fitting to a second adapter manifold extending from the high purity chemical container, and at the other end by a low dead space fitting to a source of push gas, a source of purge gas, or a source of vacuum.

The embodiment of a first method for purging high purity interfaces comprises blowing purge gas through the first purging manifold in the first embodiment, and pressurizing the second purging manifold. Optionally, vacuum may also be applied to the both purging manifolds.

A second embodiment comprises a first purging manifold as in the first embodiment, and a second purging manifold connecting the second adapter manifold with low dead space fittings to a source of push gas, a source of purge gas, a source of vacuum; and to a source of vent.

The embodiment of a second method for purging high purity interfaces comprises blowing purge gas through both the first and the second purging manifolds in the second embodiment. Optionally, vacuum may also be applied to the both purging manifolds.

A primary advantage of the present invention is to teach a system for purging high purity interfaces system that is simple to construct and that does not require the use of costly specialty valves.

Another advantage of the present invention is to teach a method for purging high purity interfaces that is simple to perform and that is faster and more economical that the prior art.

A further advantage of the present invention is to teach a system for purging high purity interfaces wherein potential areas of entrapment of the low vapor pressure chemical within the system are eliminated.

Yet another advantage of the present invention is to teach a system for purging high purity interfaces that is compact, and that is compatible with existing CVD processes.

These and other advantages of the present invention will become apparent from a reading of the following description, and may be realized by means of the instrumentalities and combinations particularly pointed out in the appended claims.

BRIEF DESCRIPTION OF THE SEVERAL VIEWS OF THE DRAWINGS

The drawings constitute a part of this specification and include exemplary embodiments of the invention, which may be embodied in various forms. It is to be understood that in some instances various aspects of the invention may be shown exaggerated or enlarged to facilitate an understanding of the invention.

DETAILED DESCRIPTION OF THE INVENTION

Detailed descriptions of embodiments of the invention are provided herein. It is to be understood, however, that the present invention may be embodied in various forms. Therefore, the specific details disclosed herein are not to be interpreted as limiting, but rather as a representative basis for teaching one skilled in the art how to employ the present invention in virtually any detailed system, structure, or manner.

Figure 1:
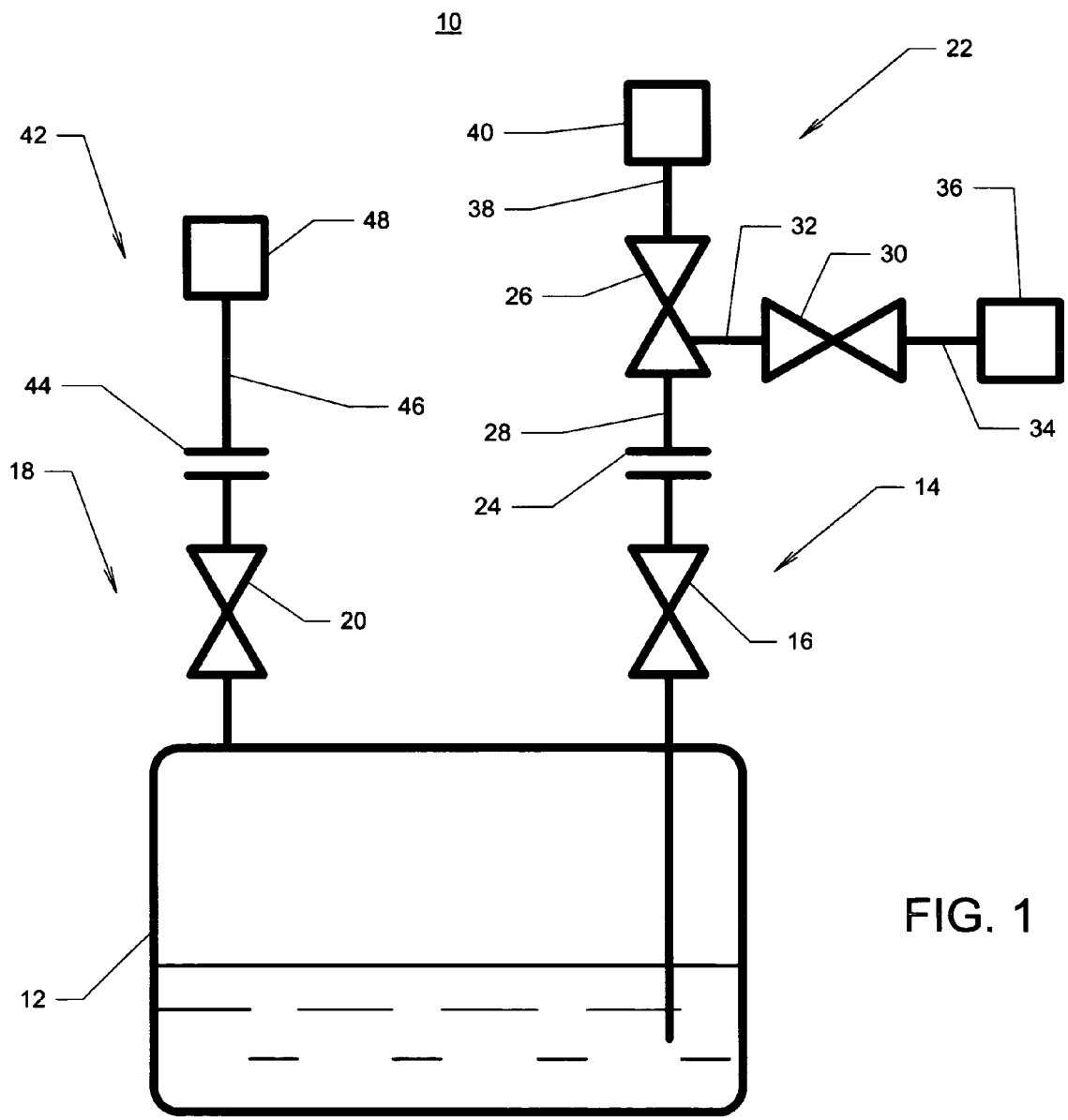
FIG. 1 illustrates a schematic diagram of a first embodiment of the invention.

In accordance with the present invention, there is shown in FIG. 1 a first embodiment 10 of the invention. A container 12, suitable for the storage of a low vapor pressure chemical, is connected to the outside environment by a first adapter manifold 14, comprising a first adapter valve 16, and by a second adapter manifold 18, comprising a second adapter valve 20.

A first purging manifold 22 is connected to the first adapter manifold 14 by a first low dead space fitting 24, preferably of low obstruction VCR design. First purging manifold 22 comprises a first diaphragm valve 26, connected to first low dead space fitting 24 by a first conduit 28, and a second diaphragm valve 30, connected to first diaphragm valve 26 by a second conduit 32, which extends from the same side of first diaphragm valve 26 as first conduit 28. All conduits described in the present invention are preferably pressurization tubes.

A third conduit 34 extends from the side of second diaphragm valve 30 opposite to second conduit 32, and is connected by a second low dead space fitting 36 to a first source, which comprises a source of vent or a source of vacuum. Second low dead space fitting 36, which may be, among others, a low obstruction VCR fitting, a Fujikin UPG gasket fitting, or a Hy-Tech full Bore 002 fitting.

A fourth conduit 38 connects first diaphragm valve 26 to a third low dead space fitting 40, which may also be, among others, a low obstruction VCR design, a Fujikin UPG gasket fitting, or a Hy-Tech full Bore 002. Fourth conduit 38 further connects first diaphragm valve 26 to a second source, which comprises a process tool, a second high purity chemical container, a source of purge gas, or a source of vacuum.

Instead, second adapter manifold 18 is connected to a second purging manifold 42 by a fourth low dead space fitting 44, which is preferably of low obstruction VCR design. Second purging manifold comprises a fifth conduit 46, connected at one end to fourth low dead space fitting 44, and at the other end to a fifth low dead space fitting 48, which in turn connects fifth conduit 46 with a third source, comprising a source of push gas, a source of purge gas, or a source of vacuum.

Each one of the diaphragm valves described herein may be actuated manually, pneumatically, or through a solenoid, and each will preferably have a medium or high CV. The seat side of first diaphragm valve 26 is preferably oriented in the direction of third dead space fitting 40, and the seat of second diaphragm valve 30 is preferably oriented in the direction of first diaphragm valve 26.

In a first variation of first embodiment 10, second conduit 32 is not connected directly to first diaphragm valve 26, but instead to first conduit 28. In a second variation of first embodiment 10, first diaphragm valve 26 and second diaphragm valve 30 may be combined in a dual valve block.

The purge method of high purity interfaces according to first embodiment 10 is summarized in Table I.

TABLE I (a) Close first diaphragm valve 26, and open second diaphragm valve 30. Blow purge gas from the second source into third low dead space fitting 40, and vent into the first source through second low dead space fitting 36.
(b) Close second adapter valve 20 and pressurize fifth conduit 46 by blowing purge gas from the third source into fifth low dead space fitting 48.
(c) Repeat steps (a) and (b) to remove chemical from first purging manifold 22 and second purging manifold 42 to a predetermined level.
(d) Optionally, apply vacuum from the second source through third low dead space fitting 40, and from the third source through fifth low dead space fitting 48.

One skilled in the art will appreciate that different variations in the cycles of Table I are possible, all falling within the scope of the present invention. For instance, different steps of the purge cycle in Table I may be individually repeated until a desired level of decontamination is achieved, or additional steps may be introduced, such as solvent cleaning.

Figure 2:
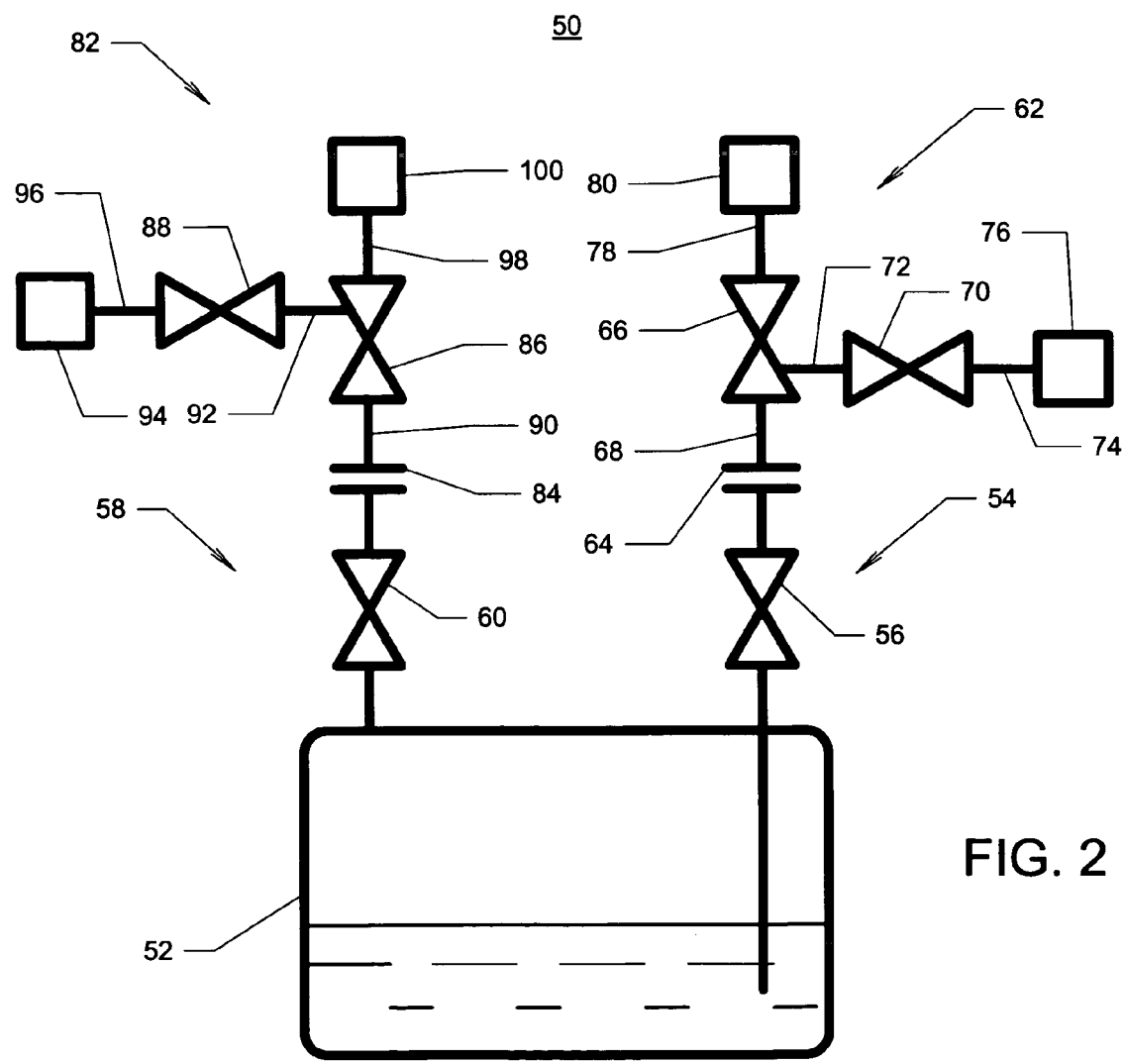
FIG. 2 illustrates a schematic diagram of a second embodiment of the invention.

Turning now to FIG. 2, there is shown a second embodiment 50 of the invention. A container 52, suitable for the storage of a low vapor pressure chemical, is connected to the outside environment by a first adapter manifold 54, which comprises a first adapter valve 56, and by a second adapter manifold 58, which comprises a second adapter valve 60.

A first purging manifold 62 is connected to the first adapter manifold 54 by a first low dead space fitting 64, preferably of low obstruction VCR design. First purging manifold 62 comprises a first diaphragm valve 66, connected to first low dead space fitting 64 by a first conduit 68, and a second diaphragm valve 70, connected to first diaphragm valve 66 by a second conduit 72, extending from the same side of first diaphragm valve 66 as first conduit 68.

A third conduit 74 extends from the side of second diaphragm valve 70 opposite to second conduit 72, and is connected by a second low dead space fitting 76 to a first source, which comprises a source of vent or a source of vacuum. Second low dead space fitting 76, which may be, among others, a low obstruction VCR fitting, a Fujikin UPG gasket fitting, or a Hy-Tech full Bore 002 fitting.

A fourth conduit 78 connects first diaphragm valve 66 to a third low dead space fitting 80, which may be, among others, a low obstruction VCR fitting, a Fujikin UPG gasket fitting, or a Hy-Tech full Bore 002, and which connects first diaphragm valve 66 to a second source, comprising a process tool, a second high purity chemical container, a source of purge gas, or a source of vacuum.

Instead, a second purging manifold 82 is connected to second adapter manifold 58 by a fourth low dead space fitting 84, preferably of VCR design. Second purging manifold 82 comprises a third diaphragm valve 86 and a fourth diaphragm valve 88, wherein one side of third diaphragm valve 86 is connected to fourth low dead space fitting 84 by a fifth conduit 90, and wherein the other side of third diaphragm valve 86 is connected to one side a fourth diaphragm valve 88 by a sixth conduit 92. The opposite side of fourth diaphragm valve 88 is instead connected to a fifth low dead space fitting 94 by a seventh conduit 96. Fifth low dead space fitting 94 connects seventh conduit 96 to a third source, including a source of purge gas or a source of vent. Fifth low dead space fitting 94 and sixth low dead space fitting 100 are preferably of low obstruction VCR design, a Fujikin UPG gasket fitting, or a Hy-Tech full Bore 002 fitting.

An eight conduit 98 connects to one end of sixth low dead space fitting 100 the same side of third diaphragm valve 86 as that connected to sixth conduit 92, while the other end of sixth low dead space fitting 100 is connected to a fourth source, which comprises a source of push gas, a source of purge gas, a source of vent, or a source of vacuum.

All valves may be actuated manually, pneumatically, or through a solenoid, and have preferably a medium or high CV. As in first embodiment 10, different variations are possible within second embodiment 50. For instance, second conduit 72 may be connected to first conduit 68 and not to first diaphragm valve 66; and sixth conduit 92 may be connected to fifth conduit 90 and not to third diaphragm valve 86. Further, first diaphragm valve 66 and second diaphragm valve 70 may be combined in a dual valve block, or third diaphragm valve 86 and fourth diaphragm valve 88 may be combined in a dual valve block.

The seat side of first diaphragm valve 66 is preferably oriented in the direction of third dead space fitting 80, and the seat of second diaphragm valve 70 is preferably oriented in the direction of first diaphragm valve 66. Conversely, the seat side of third diaphragm valve 86 is preferably in the direction of the sixth low dead space fitting 100, and the seat side of fourth diaphragm valve 88 is preferably in the direction of sixth conduit 92. Moreover, sixth conduit 92 may be connected to the same side of third diaphragm valve 86 as fifth conduit 90, instead of the same side as seventh conduit 98; and also, sixth conduit 92 may consist of a plurality of segments connected by low dead space fittings, such as low obstruction VCR fittings, a Fujikin UPG gasket fittings, or a Hy-Tech full Bore 002 fittings.

The purge method of high purity interfaces according to first embodiment 50 is summarized in Table II.

TABLE II (a) Close first diaphragm valve 26, and open second diaphragm valve 30. Blow purge gas from the second source into third low dead space fitting 40, and vent into the first source through second low dead space fitting 36.
(b) Close third diaphragm valve 86, and open fourth diaphragm valve 88. Blow purge gas from the fourth source into sixth low dead space fitting 100, and vent into the third source through fifth low dead space fitting 94.
(c) Repeat steps (a) and (b) to remove chemical from first purging manifold 62 and second purging manifold 82 to a predetermined level.
(d) Optionally, apply vacuum from the second source through third low dead space fitting 80, and from the fourth source through sixth low dead space fitting 100.

One skilled in the art will appreciate that different variations in the cycles of Table II are possible, all falling within the scope of the present invention. For instance, individual steps of the purge cycle in Table II may be repeated until a desired level of decontamination is achieved, or additional steps may be introduced, such as solvent cleaning. Further, sixth low dead space fitting 100 may be connected to third low dead space fitting 80, and purge gas may be blown into second purging manifold 82 through fifth low dead space fitting 94, exiting through sixth low dead space fitting 100, entering then first purging manifold 62 through third low dead space fitting 80 and exiting through second low dead space fitting 76.

While the invention has been described in connection with a number of embodiments, it is not intended to limit the scope of the invention to the particular forms set forth, but on the contrary, it is intended to cover such alternatives, modifications, and equivalents as may be included within the scope of the invention.

What is claimed is:

1. A system for purging high purity interfaces comprising:
    a first purging manifold comprising,
        a first diaphragm valve having a first side and a second side,
        a first conduit extending from the first side,
        a first low dead space fitting, connecting the first conduit to first adapter manifold extending from a first high purity chemical container,
        a second diaphragm valve having a third side and a fourth side,
        a second conduit connecting the third side to the first side,
        a third conduit extending from the fourth side,
        a second low dead space fitting, connecting the third conduit to a first source, wherein the first source is a source of vent or a source of vacuum,
        a fourth conduit extending from the second side,
        a third low dead fitting, connecting the fourth conduit to a second source, wherein the second source is a process tool, a second high purity chemical container, a source of purge gas, or a source of vacuum; and
    a second purging manifold, comprising,
        a fifth conduit having a first end and a second end,
        a fourth low dead space fitting, connecting the first end to a second adapter manifold extending from the first high purity chemical container, and
        a fifth low dead space fitting, connecting the second end to a third source, wherein the third source is a source of push gas, a source of purge gas, or a source of vacuum.

2. The system for purging high purity interfaces of claim 1, wherein the first diaphragm valve has the seat side on the second side, and wherein the second diaphragm valve has the seat side on the third side.

3. The system for purging high purity interfaces of claim 1, wherein the first low dead space fitting and the fourth low dead space fitting are of the VCR type.

4. The system for purging high purity interfaces of claim 1, wherein the first diaphragm valve and the second diaphragm valve are combined in a dual valve block.

5. The system for purging high purity interfaces of claim 1, wherein the second conduits connects the second diaphragm valve to the first conduit and not to the first diaphragm valve.

6. A system for purging high purity interfaces comprising:
    a first purging manifold comprising,
        a first diaphragm valve having a first side and a second side,
        a first conduit extending from the first side,
        a first low dead space fitting, connecting the first conduit to a first adapter manifold extending from a first high purity chemical container,
        a second diaphragm valve having a third side and a fourth side,
        a second conduit connecting the third side to the first side,
        a third conduit extending from the fourth side,
        a second low dead space fitting, connecting the third conduit to a first source, wherein the first source is a source of vent or a source of vacuum,
        a fourth conduit extending from the second side,
        a third low dead fitting, connecting the fourth conduit to a second source, wherein the second source is a process tool, a second high purity chemical container, a source of purge gas, or a source of vacuum; and
    a second purging manifold, comprising,
        a third diaphragm valve having a fifth side and a sixth side,
        a fifth conduit extending from the fifth side,
        a fourth low dead space fitting, connecting the fifth conduit to a second adapter manifold extending from the first high purity chemical container,
        a fourth diaphragm valve having a seventh side and an eighth side,
        a sixth conduit connecting the sixth side to the seventh side,
        a seventh conduit extending from the eighth side,
        a fifth low dead space fitting, connecting the seventh conduit to a third source, wherein the third source is a source of purge gas or a source of vent,
        an eight conduit extending from the sixth side, and
        a sixth low dead space fitting, connecting the eighth conduit to a fourth source, wherein the fourth source is a source of push gas, a source of purge gas, a source of vent, or a source of vacuum.

7. The system for purging high purity interfaces of claim 6, wherein the third diaphragm valve has the seat side on the sixth side, and wherein the fourth diaphragm valve has the seat side on the seventh side.

8. The system for purging high purity interfaces of claim 6, wherein the first low dead space fitting and the fourth low dead space fitting are of the VCR type.

9. The system for purging high purity interfaces of claim 6, wherein the first diaphragm valve and the second diaphragm valve are combined in a dual valve block.

10. The system for purging high purity interfaces of claim 6, wherein the third diaphragm valve and the fourth diaphragm valve are combined in a dual valve block.

11. The system for purging high purity interfaces of claim 6, wherein the second conduits connects the second diaphragm valve to the first conduit and not to the first diaphragm valve.

12. The system for purging high purity interfaces of claim 6, wherein the sixth conduit comprises a plurality of conduit segments connected by low dead space fittings.

13. The system for purging high purity interfaces of claim 6, wherein the sixth conduit connects the fifth side to the seventh side, and not the sixth side to the seventh side.

14. The system for purging high purity interfaces of claim 6, wherein the sixth conduits connects the fourth diaphragm valve to the fifth conduit and not to the third diaphragm valve.

15. A method for purging high purity interfaces comprising the steps of:
    (a) interposing a first purging manifold between a first adapter manifold extending from a first high purity chemical container and a plurality of sources, the first adapter manifold comprising a first adapter valve regulating flow to and from the first high purity chemical container, the first purging manifold comprising,
        a first diaphragm valve having a first side and a second side, a first conduit extending from the first side,
a first low dead space fitting, connecting the first conduit to the first adapter manifold,
a second diaphragm valve having a third side and a fourth side,
a second conduit connecting the third side to the first side,
a third conduit extending from the fourth side,
a second low dead space fitting, connecting the third conduit to a first of the plurality of sources, wherein the first source is a source of vent or a source of vacuum,
a fourth conduit extending from the second side,
a third low dead fitting, connecting the fourth conduit to a second of the plurality of sources, wherein the second source is a process tool, a second high purity chemical container, a source of purge gas, or a source of vacuum;
(b) interposing a second purging manifold between a second adapter manifold extending from the first high purity chemical container and the plurality of sources, the second adapter manifold comprising a second adapter valve regulating flow to and from the first high purity chemical container, the second purging manifold comprising,
a fifth conduit having a first end and a second end,
a fourth low dead space fitting, connecting the first end to the second adapter manifold, and
a fifth low dead space fitting, connecting the second end to a third source, wherein the third source is a source of push gas, a source of purge gas, or a source of vacuum;
(c) closing the first diaphragm valve, opening the second diaphragm valve, blowing purge gas from the second source into the third low dead space fitting, and venting into the first source through the second low dead space fitting; and
(d) closing the second adapter valve and pressurizing the fifth conduit by blowing purge gas from the third source into the fifth low dead space fitting.

16. The method for purging high purity interfaces of claim 15, further comprising the step of:
(e) applying vacuum from the second source through the third low dead space fitting, and from the third source through the fifth low dead space fitting.

17. A method for purging high purity interfaces comprising the steps of:
(a) interposing a first purging manifold between a first adapter manifold extending from a first high purity chemical container and a plurality of sources, the first purging manifold comprising,
a first diaphragm valve having a first side and a second side,
a first conduit extending from the first side,
a first low dead space fitting, connecting the first conduit to the adapter manifold,
a second diaphragm valve having a third side and a fourth side,
a second conduit connecting the third side to the first side,
a third conduit extending from the fourth side,
a second low dead space fitting, connecting the third conduit to a first of the plurality of sources, wherein the first source is a source of vent or a source of vacuum,
a fourth conduit extending from the second side,
a third low dead fitting, connecting the fourth conduit to a second of the plurality of sources, wherein the second source is a process tool, a second high purity chemical container, a source of gas, or a source of vacuum;
(b) interposing a second purging manifold between a second adapter manifold extending from the first high purity chemical container and the plurality of sources, the second purging manifold comprising,
a third diaphragm valve having a fifth side and a sixth side,
a fifth conduit extending from the fifth side,
a fourth low dead space fitting, connecting the fifth conduit to the second adapter manifold,
a fourth diaphragm valve having a seventh side and an eighth side,
a sixth conduit connecting the sixth side to the seventh side,
a seventh conduit extending from the eighth side,
a fifth low dead space fitting, connecting the seventh conduit to a third source, wherein the third source is a source of gas, a source of vent, or a source of vacuum,
an eight conduit extending from the sixth side, and
a sixth low dead space fitting, connecting the eighth conduit to a fourth source, wherein the fourth source is a source of push gas, a source of purge gas, or a source of vacuum;
(c) closing the first diaphragm valve, opening the second diaphragm valve, blowing purge gas from the second source into the third low dead space fitting, and venting into the first source through the second low dead space fitting; and
(d) closing the third diaphragm valve, opening the fourth diaphragm valve, blowing purge gas from the fourth source into the sixth low dead space fitting, and venting into the third source through the fifth low dead space fitting.

18. The method for purging high purity interfaces of claim 17, further comprising the step of:
(e) applying vacuum from the second source through the third low dead space fitting, and from the fourth source through the sixth low dead space fitting.

* * * * *